United States Patent [19]
Kobatake

[11] Patent Number: 5,815,441
[45] Date of Patent: Sep. 29, 1998

[54] NON-VOLATILE SEMICONDUCTOR MEMORY DEVICE

[75] Inventor: Hiroyuki Kobatake, Tokyo, Japan

[73] Assignee: NEC Corporation, Tokyo, Japan

[21] Appl. No.: 943,413

[22] Filed: Sep. 30, 1997

[30] Foreign Application Priority Data

Sep. 30, 1996 [JP] Japan .................................. 8-259370

[51] Int. Cl.$^6$ ................................................ G11C 13/00
[52] U.S. Cl. ............................... 365/185.29; 365/185.11; 365/218
[58] Field of Search ......................... 365/185.29, 185.26, 365/218, 185.11

[56] References Cited

U.S. PATENT DOCUMENTS 5,530,828  6/1996  Kaki et al. ..................... 365/185.29 X
5,648,929  7/1997  Miyamoto ....................... 365/185.29 X
5,687,117  11/1997 Chevallier et al. ............. 365/185.29 X

FOREIGN PATENT DOCUMENTS

6-309886  11/1994  Japan .

*Primary Examiner*—Do Hyun Yoo
*Attorney, Agent, or Firm*—Foley & Lardner

[57] ABSTRACT

A non-volatile semiconductor memory device includes an EEPROM array section and a flash memory array section formed on a single chip. The EEPROM memory array section is subjected to a bite-by-bite mode erasure whereas the flash memory array section is subjected to a batch mode erasure. The floating gate of the EEPROM array section has a large area than the floating gate of the flash memory array section.

5 Claims, 7 Drawing Sheets

NON-VOLATILE SEMICONDUCTOR MEMORY DEVICE

BACKGROUND OF THE INVENTION (a) Field of the Invention

The present invention relates to a non volatile semiconductor memory device having electrically rewritable and erasable non-volatile memory cells.

(b) Description of the Related Art

An electrically rewritable and erasable non-volatile semiconductor memory device generally comprises a plurality of memory cell transistors having drain and source regions spaced from each other on a semiconductor substrate, a floating gate formed on a gate insulation film and above a channel region between the drain region and the source region, and a control gate formed above the floating gate with an intervention of a second gate insulating film.

The non-volatile memory device as described above is classified into a so-called flash memory in which memory cells are erasable in a batch mode, and an EEPROM (electrically erasable programmable ROM) in which memory cells are erasable in a bit-by-bit or byte-by-byte mode.

The flash memory is generally used to store programs, for instance, which is less subject to rewriting. The EEPROM, on the other hand, is mainly used to store data which is subject to frequent rewriting in a bit-by-bit or byte-by-byte mode.

Here, writing and erasing of the flash memory and EEPROM will be briefly discussed. Most flash memories have an erasure operation for memory cells by injecting electrons to the floating gate to thereby increase the threshold voltage with respect to the control gate. Some types of flash memory have a erasure mode for releasing electrons from the floating gate by a Fowler-Nordheim (F-N) tunneling effect, whereby the threshold voltage of the memory cells are lowered with respect to the control gate. In the latter case, the writing operation is performed by generating a conductivity-inverted area on the surface of the substrate within the drain-source region to inject hot electrons (HE) into the floating gate, thereby increasing the threshold voltage of the memory cells. There is also another type of flash memory in which the F-N tunneling effect is utilized in both the erasing and writing operations.

There has been proposed an EEPROM in which both the erasing and writing operations are performed by using the F-N tunneling effect to exchange electrons between the floating gate and a specific region other than the drain-source region on the substrate.

In the injection of electrons into and release of electrons from the floating gate by the F-N tunneling effect as discussed above, the rewriting rate is as low as approximately 1 ms per bit, although there is an advantage in that a small current of approximately 1 $\mu$A per bit flowing between the source and drain regions is enough for the writing and erasing operations. On the other hand, when the writing or erasing operation is performed by the injection of the hot electrons, a large current of approximately 1 mA per bit flowing between the source and drain regions is necessary, although there is an advantage of a smaller writing or erasing time of approximately 10 microsecond ($\mu$s) per bit compared to the case of using the F-N tunneling effect which requests approximately 1millisecond (ms) per bit.

Considering the above, in an EEPROM which is subject to frequent erasing and rewriting operations, a structure is normally employed for the memory cells in which a large area of the floating gate and a small distance between the floating gate and the substrate are provided to enhance the F-N tunneling effect. This makes a structural difference between the memory cells of the EEPROM and those of the flash memory.

Recently, a non-volatile semiconductor memory has been proposed in which both the flash memory for storing programs and the EEPROM for storing data are formed on a single chip. In this structure, however, both the memory arrays are fabricated by different fabrication steps.

There is also another proposal for a non-volatile semiconductor memory, as described in Patent Publication No. JP-A-6(1994)-309886, in which a plurality of memory cells arranged in an array are electrically rewritable and erasable in both the bit-by-bit and block-by-block modes. In the proposed memory device, the erasing operation in either a bit-by-bit or block-by-block mode is achieved by selecting voltages applied from outside to the drain, source and control gate of each of the memory cells to thereby allow the memory cell to enter one of the two erasing modes.

In the patent publication as mentioned above, no consideration has been given to the arrangement of the flash memory and the EEPROM in a single chip, in other words, to coexistence of the flash memory and the EEPROM. It does not either discuss the advantages or problems residing in the coexistence.

SUMMARY OF THE INVENTION

It is an object of the present invention to provide a non-volatile semiconductor memory device having a flash memory and an EEPROM formed in a single chip at a low cost, in which programs and data can be stored separately.

The present invention provides, in a first aspect thereof, a non-volatile semiconductor memory device comprising a semiconductor substrate, first non-volatile memory array section formed on the semiconductor substrate and having a plurality of memory transistors, a second non-volatile memory array section formed on the semiconductor substrate and having a plurality of memory cell transistors, a first erasing section for erasing the memory cell transistors of the first non-volatile memory section in a group-by-group mode, a second erasing section for erasing the memory cell transistors of the second non-volatile memory section in a batch mode, the memory cell transistors of the first and second non-volatile memory array sections having a common structure in source, drain, control gate and floating gate.

The present invention further provides, in the second aspect thereof, a non-volatile semiconductor memory device comprising a semiconductor substrate, first non-volatile memory array section formed on the semiconductor substrate and having a plurality of memory transistors, a second non-volatile memory array section formed on the semiconductor substrate and having a plurality of memory cell transistors, a first erasing section for erasing the memory cell transistors of the first non-volatile memory section in a separate mode, a second erasing section for erasing the memory cell transistors of the second non-volatile memory section in a batch mode, the memory cell transistors of the first non-volatile memory array section including a floating gate having an area which is larger than an area of a floating gate of memory cell transistor of the second non-volatile memory array section.

In accordance with the present invention, the semiconductor memory device having both the first non-volatile memory section (preferably, EEPROM) and the second non-volatile memory section (preferably, flash memory) in a single chip can be manufactured by a common process and at a low cost. The erasing time for the first non-volatile memory section can be reduced either by erasing the memory cells therein in a group-by-group mode instead of bit-by-bit mode or by increasing the area of the floating gate of the memory cells.

The above and other objects, features and advantages of the present invention will be more apparent from the following description, referring to the accompanying drawings.

DESCRIPTION OF THE PREFERRED EMBODIMENTS

Now, the present invention is more specifically described with reference to accompanying drawings, wherein similar constituent elements are designated by the same or similar reference numerals throughout the drawings.

Figure 1:
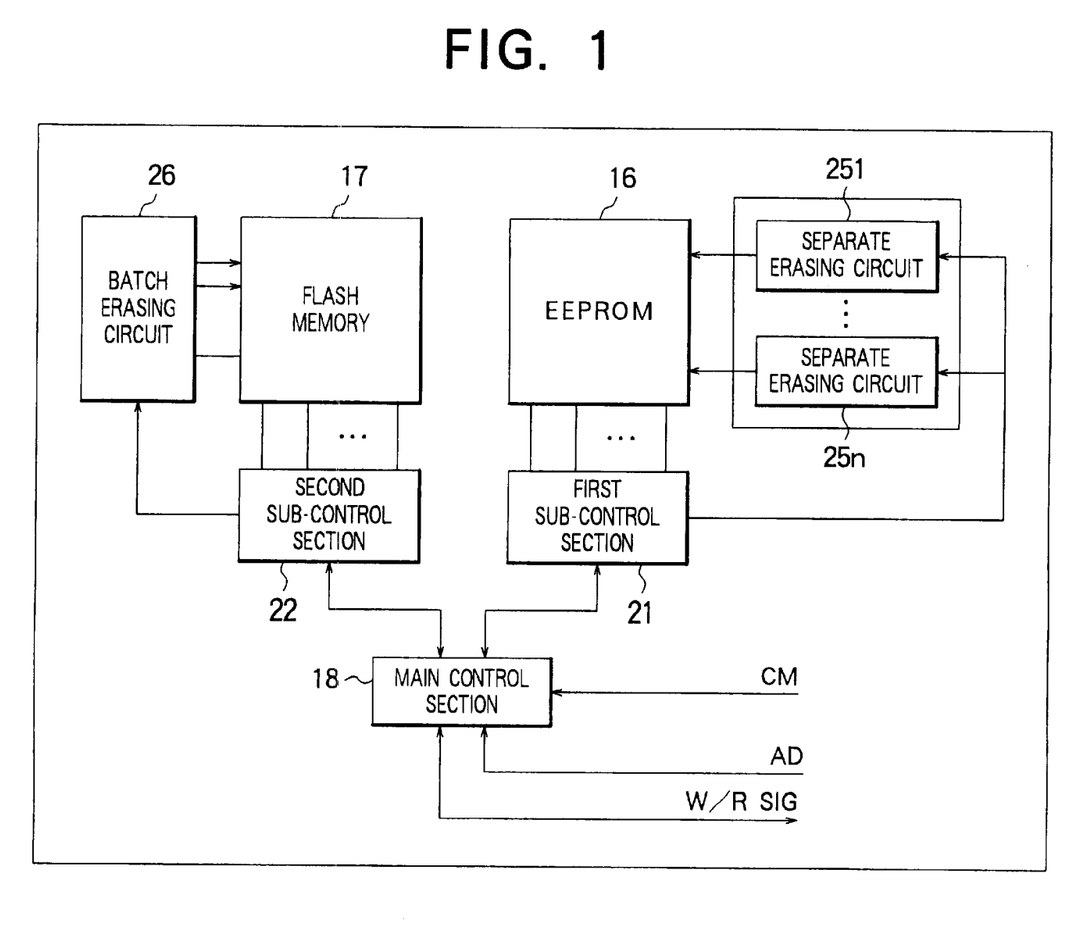
FIG. 1 is a block diagram of a non-volatile semiconductor memory device having flash memory and EEPROM memory sections according to a first embodiment of the present invention.

Referring to FIG. 1, a non-volatile semiconductor memory device according to a first embodiment of the present invention comprises an EEPROM array section 16 and a flash memory array section 17 separately formed in a single semiconductor chip 11. The EEPROM array section 16 is hereinafter referred to also as first non-volatile memory, which has a memory capacity of around 128–256 bytes, and the flash memory array section 17 is referred to also as second non-volatile memory, which has a memory capacity larger than that of the first non-volatile memory 16 (256 k bytes, for instance).

The memory cells constituting the first and second non-volatile memories 16 and 17 are, as will be described later, fabricated by a common memory cell fabrication process. The first non-volatile memory section 16 is generally used for storing data which are subjected to relatively frequent rewriting and erasing, whereas the second non-volatile memory section 17 is generally used for storing programs which are less subjected to rewriting and erasing.

It is assumed that, in the illustrated embodiment, different addresses are assigned to the first and second non-volatile memories 16 and 17, and accordingly, an access to either the first non-volatile memory 16 or the second non-volatile memory 17 can be distinguished from an addressing signal AD.

There are further provided, on the semiconductor chip 11, a main control section 18 for receiving a command signal CM, the addressing signal AD and a write/read signal W/RSIG, a first sub-control section 21 for controlling the writing, reading and erasing operations of the first non-volatile memory 16 under the control of the main control section 18, and a second sub-control section 22 for controlling the writing, reading and erasing operations of the second non-volatile memory 17 under the control of the main control section 18.

A plurality of separate erasing circuits 251-25$n$ are connected with the first non-volatile memory 16 for erasing the memory cells in the first non-volatile memory 16 in a separate erasing mode, namely, byte-by-byte or group-by-group mode under the control of the first sub-control section 21. A batch erasing circuit 26 is connected with the second non-volatile memory 17 for erasing the second non-volatile memory 17 in a batch erasing mode under the control of the second sub-control section 22.

The main control section 18 transfers the command signal CM and the addressing signal AD to either the first non-volatile memory 16 or the second non-volatile memory 17, after distinguishing which of the writing, reading and erasing operations the command signal CM represents, and which of the first and second non-volatile memories 16 and 17 the addressing signal AD specifies. The main control section 18 further transfers data between the same and an external circuit (not shown), which are written to and read out from either the first non-volatile memory 16 or the second non-volatile memory 17.

The first sub-control section 21 reads data from the first non-volatile memory 16 in accordance with the command signal given for the first non-volatile memory 16 from the main control section 18, and outputs an erase command signal to the separate erasing circuits 251-25$n$ to erase data at the specified addresses in a byte-by-byte mode. In the configurations as described above, data can be written in a bit-by-bit or byte-by-byte mode to the memory addresses which have been erased.

The second sub-control section 22 reads instructions from the second non-volatile memory 17 in accordance with the command signal given for the second non-volatile memory 17 from the main control section 18, and outputs a batch erase command signal to the batch erasing circuit 26 to erase the contents of the memory cells in the second non-volatile memory 17 in a batch mode. Instructions constituting a program can be written in succession to the memory cells in the second non-volatile memory 17 that has been erased.

The memory cells in the first and second non-volatile memories 16 and 17 have similar structures. Specifically, referring to FIGS. 2A and 2B, each memory cell in the non-volatile memory device of FIG. 1 is formed on a P-type semiconductor substrate 31. There are provided on the semiconductor substrate 31 a pair of N-type source regions 32a and 32b and an N-type drain region 33 disposed between the source regions 32a and 32b. A channel regions is provided between each of the source regions 32a and 32b and the drain region 33. Above the each channel region, a floating gate 34 is formed, with a first gate insulation layer (not shown) disposed between the substrate 31 and the floating gate 34. A control gate 35 is provided above each floating gate 34, with a second gate insulation layer (not shown) disposed between the floating age 34 and the control gate 35.

Figure 2A:
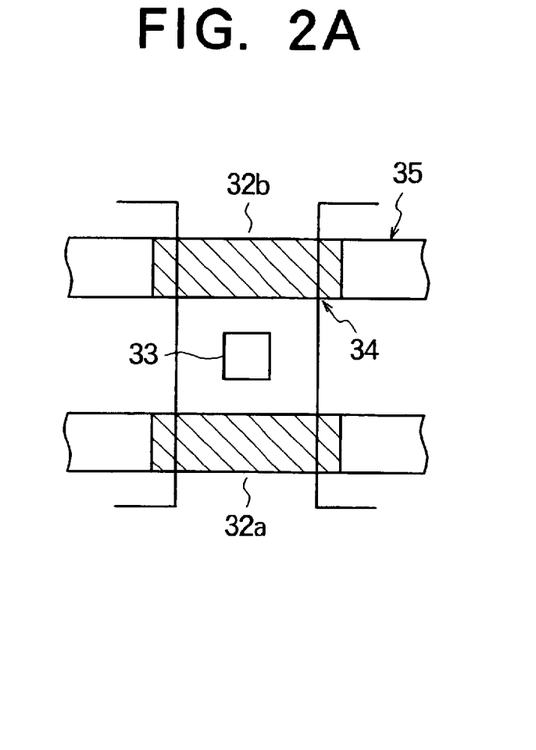
FIG. 2A is a top plan view of a memory cell used in the semiconductor memory device of FIG. 1 both for the EEPROM and flash memory sections.
Figure 2B:
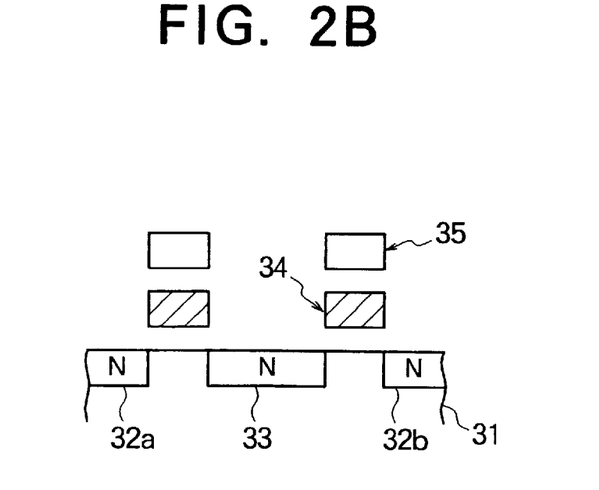
FIG. 2B is a cross-sectional view of the memory cell shown in FIG. 2A.

In the second non-volatile memory 17, the source and drain regions 32a or 32b and 33, gate insulation layers, floating gate 34 and control gate 35 in combination constitute a flash memory cell. The control gate 35 overlaps the floating gate 34 above the channel region, and extends beyond the edges of the floating gate 34 in the direction normal to the channel.

In the flash memory cells in the second non-volatile memory 17, the erasing operation is performed by applying a negative voltage of from −7 to −10volts to the drain region 33, source regions 32a and 32b, and the semiconductor substrate 31, and a positive voltage of from 7 to 10 volts to the control gates 35, thereby allowing the electrons to be injected into the floating gates 34 from the surface of the semiconductor substrate 31 by a F-N tunneling effect. As a result, a batch erasure is effected by increasing the threshold voltage with respect to the control gates.

In the writing operation, a negative voltage of from −6 to −10 volts is applied to the control gates 35, and a voltage of from 0 to 5 volts is applied to the drain regions 33, thereby allowing the electrons on the floating gates 34 to be drawn to the drain regions 33 by a F-N tunneling effect. As a result, a writing operation is effected by reducing the threshold voltage of the flash memory cells with respect to the control gate. It is to be noted that each drain region 33 is connected to a word line to enable the writing operation in a bit-by-bit mode.

In the above embodiment, the F-N tunneling effect is utilized in both the erasing and writing operations for the flash memory cells. However, in an alternative embodiment, the threshold voltage of the flash memory cells are reduced by utilizing the F-N tunneling effect in the erasing operation, whereas the threshold voltage of each memory cell is increased by injecting hot electrons into the floating gate 34 in the writing operation. In the latter type of the flash memory cell using the hot electrons, the source regions 32a and 32b are generally encircled by an $N^-$-region, and the drain region 33 is encircled by a $P^-$-region.

The structure of the batch erasing circuit 26 is well known in the art and the detailed description thereof is omitted herein.

As described before, the EEPROM cells in the first non-volatile memory 16 have a structure similar to that of the flash memory cells in the second non-volatile memory 17. Accordingly, the memory cells in the first and second non-volatile memories 16 and 17 can be fabricated substantially by a common fabrication process. The difference between the first non-volatile memory 16 and the second non-volatile memory 17 resides in that the first non-volatile memory 16 are provided with a structure that enables an erasing operation of the memory cells therein in a byte-by-byte or group-by-group mode to reduce the erasing time.

Figure 3A:
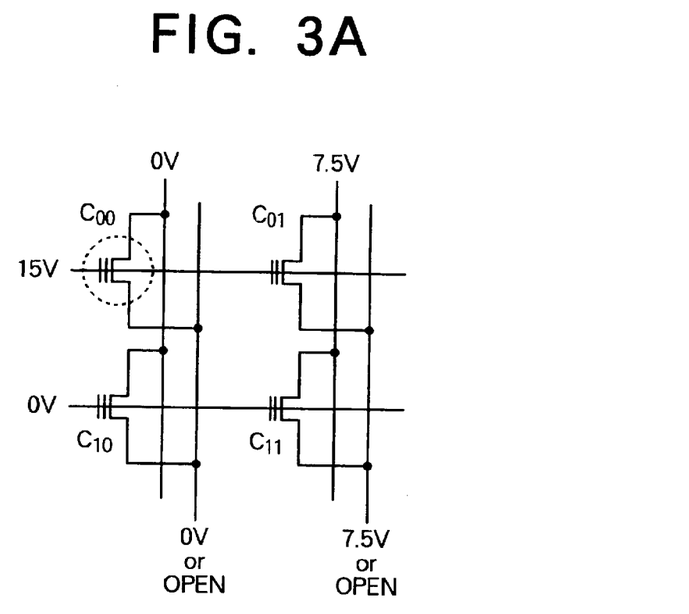
FIG. 3A is an explanatory circuit diagram showing an erasing operation of memory cells in the EEPROM section in the non-volatile memory device of FIG. 1.

FIG. 3A shows a circuit diagram of memory cells in the EEPROM, in which a number (n) of the flash memory cells such as shown in FIGS. 2A and 2B are arranged in rows (horizontal direction) and columns (vertical direction). For simplicity, there are illustrated only four flash memory cells C00, C01, C10 and C11.

First to m-th word lines each extending in the horizontal direction, are connected with the respective rows of memory cells C00 and C01, C10 and C11 arranged in the horizontal direction. These word lines are connected to the first sub-control section 21 shown in FIG. 1. The first sub-control section 21 applies a high voltage of 15 volts to the word lines for the memory cells selected for erasure, and a ground voltage of 0 volt to the word lines for the memory cells not selected.

Each of first to n-th digit line pairs extending in the vertical direction include a drain line connected with the drain regions of, and a source line connected with the source regions of the memory cell transistors arranged in a column. The drain and source lines are connected with respective separate erasing circuits 251-25n controlled by the first sub-control section 21, as shown in FIG. 1. Each of the separate erasing circuits 251-25n applies a voltage of 0 volt to the drain line corresponding to the memory cells selected for erasure, and a voltage of 7.5 volts, for instance, which is a half of 15 volts, to the drain line corresponding to the memory cells not selected. The source line for the selected memory cells is applied with 0 volt or maintained floating, and the source lines for the non-selected memory cells are applied with 7.5 volts or maintained floating.

Suppose now that the content of the memory cell C00 is to be erased, as illustrated in FIG. 3A. On this occasion, the first word line and first digit line pairs are selected, to which voltages are applied by the first sub-control section 21 and a corresponding one of the separate erasing circuits. As a result, the voltage of 15 volts is applied between the control gate and drain region of the selected memory cell C00, and the voltage of 7.5 volts is applied between the control gate and drain region of the non-selected memory cells C01, C10 and C11, respectively. Therefore, the contents of the non-selected memory cells C01, C10 and C11 are preserved, and only the content of the selected memory cell C00 is erased by injecting electrons into the floating gate.

As understood from the above description, the separate erasing circuits 251-25n have a function of applying the voltage of 0 volt or 7.5 volts to the digit lines under the control of the first sub-control section 21 in the erasing operation.. Accordingly, the EEPROM 16 (first non-volatile memory) having a structure similar to the flash memory cells as illustrated in FIGS. 2A and 2B can be erased by a bite-by-bite mode by selecting one bite of memory cells at a time.

Figure 3B:
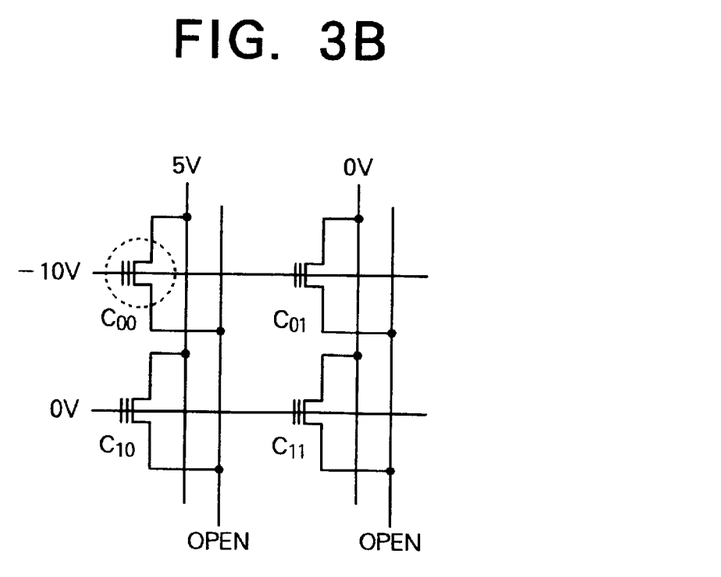
FIG. 3B is an explanatory circuit diagram showing a writing operation of the memory cells shown in FIG. 3A.

When writing data to a selected memory cell C00, the selected (first) word line is supplied with a voltage of −10 volts, and a non-selected (second) word line is supplied with a voltage of 0 volt, by the first sub-control circuit 21. Further, the drain line for the selected memory cell C00 is applied with a voltage of 5 volts, with the corresponding source line maintained floating, and the non-selected drain line are applied with a voltage of 0 volt, with the corresponding source line maintained floating. As a result, in the selected memory cell C00, electrons are drawn from the floating gate by the F-N tunneling effect, thereby lowering the threshold voltage for the writing operation.

Figure 4A:
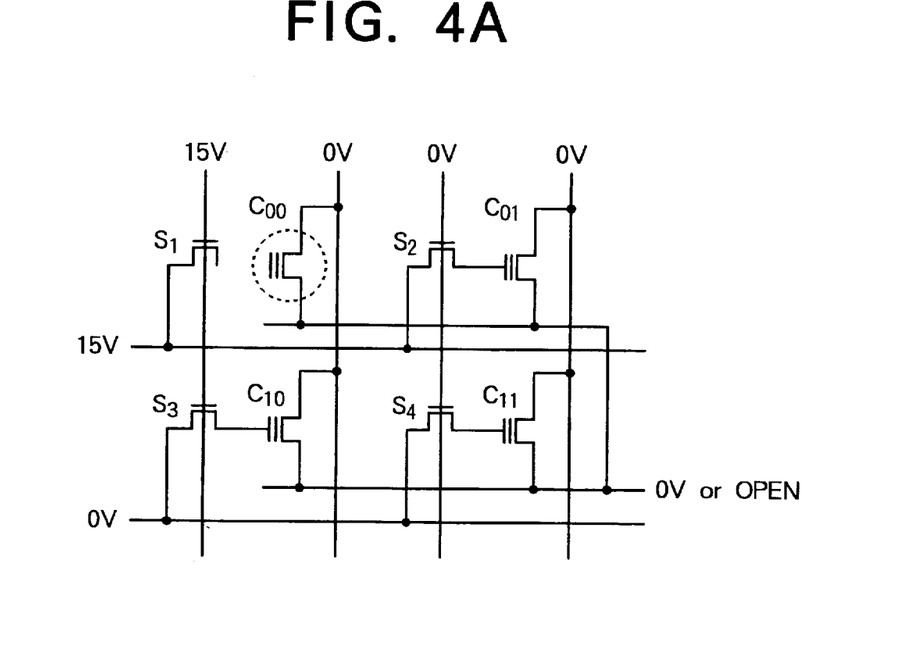
FIG. 4A is an explanatory circuit diagram showing an erasing operation of the memory cells in the EEPROM section in a non-volatile memory device according to a second embodiment of the present invention.
Figure 4B:
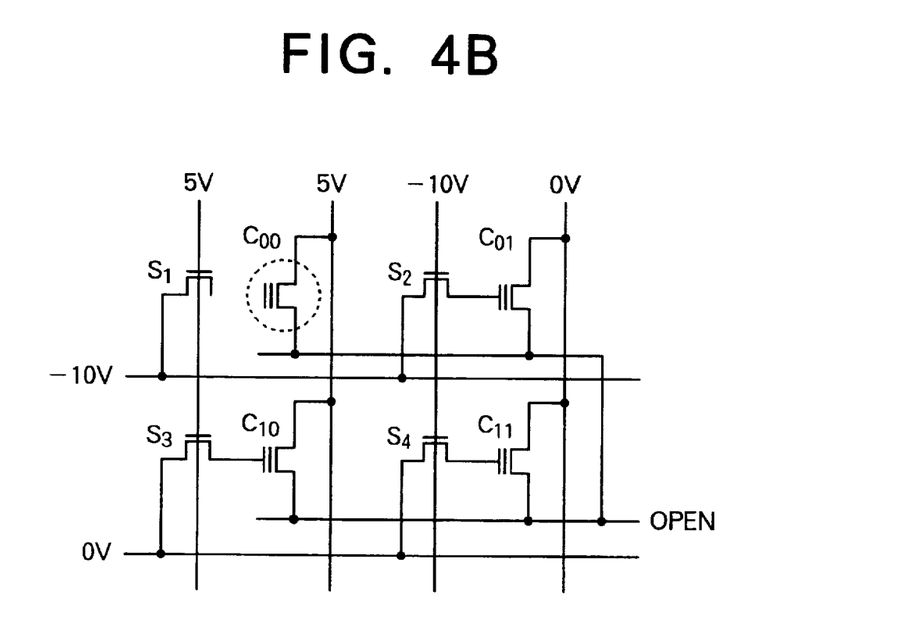
FIG. 4B is an explanatory circuit diagram showing a writing operation of the memory cells shown in FIG. 4A.

Referring to FIGS. 4A and 4B, there is shown a circuit diagram of a non-volatile memory device according to a second embodiment of the present invention. In the present embodiment, memory cells C00–C11 have a structure similar to that of the flash memory cells shown in FIGS. 2A and 2B, and therefore, can be fabricated by a process that is common to fabrication of the second non-volatile memory 17. As understood from FIG. 4A, selectors S1–S4 each implemented by a MOS transistor are provided for respective control gates of the memory cells C00–C11.

More specifically, the drain of each MOS transistor constituting the selectors S1 and S2 is connected with the first word line, and the source thereof is connected with the control gate of each of the memory cells C00 and C01. The drain of each MOS transistor constituting the selectors S3 and S4 is connected with the second word line, and the source thereof is connected with the control gate of each of the memory cells C10 and C11.

The gate of each of the MOS transistors constituting selectors S1 and S3 is connected with the first column line connected with corresponding separate erasing circuits. Similarly, the gate of each of the MOS transistors constituting selectors S2 and S4 is connected with the second column line connected with corresponding separate erasing circuits.

The drain region of each of the memory cells C00 and C10 arranged in the first column is connected with the first drain line, the drain region of each of the memory cells C10 and C11 arranged in the second column is connected with the second drain line, and the source regions of the memory cells C00–C11 are commonly connected with the separate erasing circuits.

In an erasing operation for the memory cell C00, a voltage of 15 volts is applied through the selector S1 to the control gate of the memory cell C00, and 0 volt to the drain region of the memory cell C00. At the same time, the source regions of respective memory cells are applied with 0 volt or maintained floating. Electrons are injected into the memory cell C00, raising the threshold voltage to erase the memory cell C00. The memory cell C00 can be erased in a group-by-group mode wherein the memory cell is combined with other memory cells to form a group. Similarly, other memory cells C01, C10 and C11 can be also erased in a group-by-group mode wherein these memory cells are combined with other memory cells to form respective groups for erasure.

In a writing operation for the memory cell C00, a voltage of −10 volts is applied to the first word line for the selected memory cell C00, and 5 volts is applied to the gate of the selector S1 and the drain region of the memory cell C00, respectively. Thereby, the MOS transistor constituting the selector S1 is turned ON to apply 15 volts between the drain region and the control gate of the memory cell C00, releasing the electrons in the floating gate to the drain region, to thereby reduce the threshold voltage, whereby a writing operation is performed. In other memory cells C01, C10 and C11, the writing operation can be effected similarly in a bit-by-bit mode.

Figure 5:
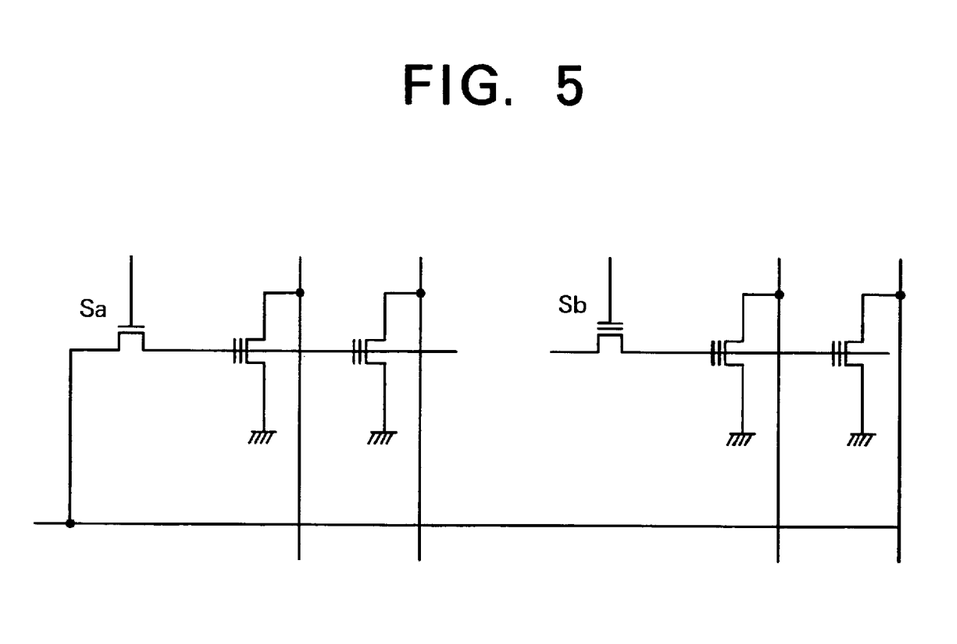
FIG. 5 is a circuit diagram of the memory cells used in the EEPROM memory section in a non-volatile memory device according to a third embodiment of the present invention.

Referring to FIG. 5, a non-volatile memory device according to a third embodiment of the present invention is similar to the memory device shown in FIGS. 4A and 4B except that the memory device of the present embodiment comprises a selector for a group of memory cells, for example, a selector Sa or Sb for every 8 memory cells or 1 byte of memory cells. A voltage of 15 volts is applied to the 8 memory cells selected by the selector, and the erasing operation for the group of memory cells is performed. The writing operation is effected similarly to the case of the memory device as shown in FIG. 4B in a bit-by-bit mode, whereby a voltage of −10 volts is applied to the control gates of the memory cells selected by the selector, and a voltage of 5 volts to the drain regions.

Figure 6A:
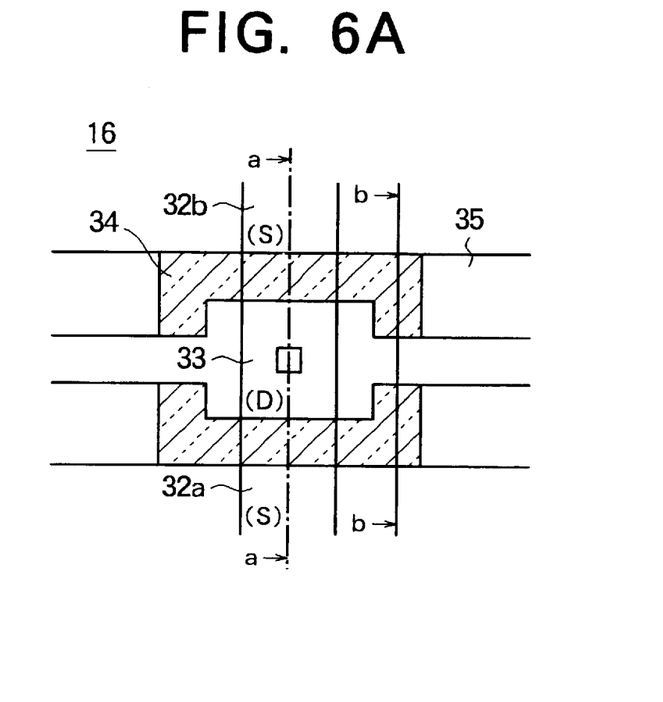
FIG. 6A is a top plan view of memory cells in the EEPROM memory section in a non-volatile memory according to a fourth embodiment of the present invention.
Figure 6B:
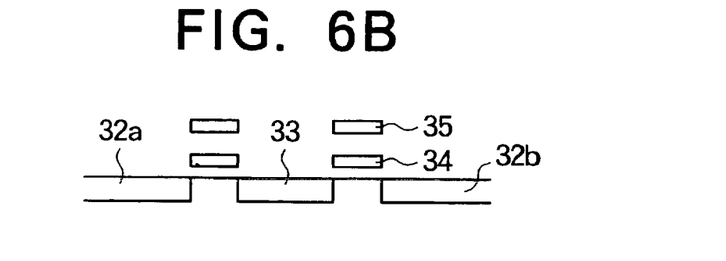
FIG. 6B is a cross-sectional view taken in line a—a shown in FIG. 6A.
Figure 6C:
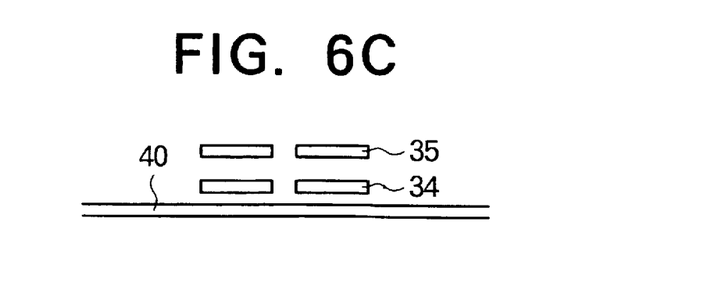
FIG. 6C is a cross-sectional view taken in line b—b in FIG. 6A.

Referring to FIGS. 6A, 6B and 6C showing a top plan view, and a cross-sectional views taken along lines a—a and b—b in FIG. 6A, respectively, of memory cells in the EEPROM array section in a non-volatile memory device according to a fourth embodiment of the present invention, the memory device is similar to the first embodiment except for the structure of the floating gates in the memory cells in the EEPROM array section.

Figure 7:
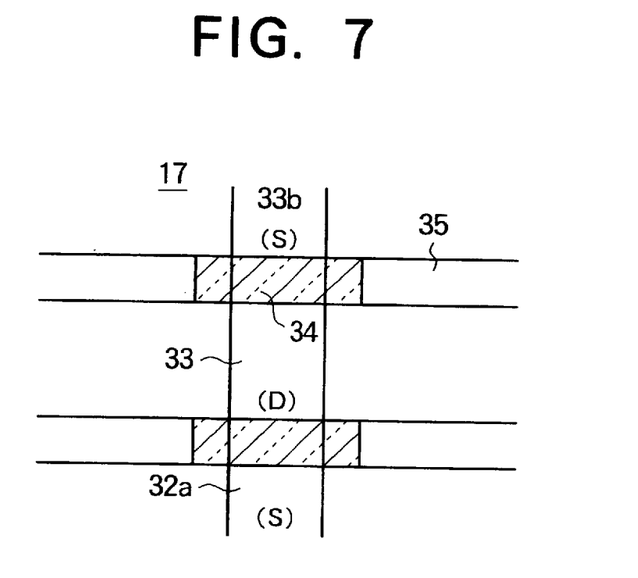
FIG. 7 is a top plan view of memory cells used in the flash memory section in the non-volatile memory device of the fourth embodiment.

Specifically, the floating gates 34 and the control gates 35 in the first non-volatile memory 16 of the present embodiment have a larger area compared to the area of the floating gates and the control gates of the flash memory cells in the second non-volatile memory in the present embodiment shown in FIG. 7, to thereby increase the capacitance between the floating gate 34 and control gate 35, which allows a smaller erasing time compared to that of the flash memory cell.

In the memory cell of the first non-volatile memory, the width of the floating gate 34 disposed between the control gate 35 and the inter-layer insulation layer 40 (see FIG. 6C) is larger compared to the width of the floating gate 34 disposed above the channel region (see FIG. 6B), and the width of the control gate 35 above the interlayer insulator layer 40 is also larger than the control gate above the channel region. As a result, the capacitance between the control gate 35 and floating gate 34 is increased, and this means that the specific structure is suitable for an EEPROM for a bit-by-bit erasure.

In the memory cell shown in FIG. 7, on the other hand, the floating gate 34 and control gate 35 have a constant width similarly to those shown in FIG. 2A, and the capacitance therebetween is smaller than that of the memory cell shown in FIGS. 6A–6C. Therefore, the memory cell shown in FIG. 7 has an erasing time longer than that of the memory cell shown in FIGS. 6A–6C, and is suitable as a flash memory for a batch mode erasure.

The memory cells for the EEPROM and flash memory shown in FIGS. 6A–6C and FIG. 7, respectively, comprise floating gates and control gates having different shapes from each other; however, these floating gates and control gates can be fabricated at a common step by using a single mask. Accordingly, the process for fabricating the first and second non-volatile memories 16 and 17 can be simplified.

In the above description, the flash memory section is erased by a batch mode for the entire flash memory section. However, the flash memory can be erased by a block-by-block mode, wherein the flash memory section is divided into a plurality of blocks memory section is divided into a plurality of blocks each suited to store one unit program.

Since the above embodiments are described only for examples, the present invention is not limited to the above embodiments and various modifications or alterations can be easily made therefrom by those skilled in the art without departing from the scope of the present invention.

What is claimed is:

1. A non-volatile semiconductor memory device comprising a semiconductor substrate, a first non-volatile memory array section formed on said semiconductor substrate and having a plurality of memory cell transistors, a second non-volatile memory array section formed on said semiconductor substrate and having a plurality of memory cell transistors, a first erasing section for erasing said memory cell transistors of said first non-volatile memory array section in a group-by-group mode, a second erasing section for erasing said memory cell transistors of said second non-volatile memory array section in a batch mode, said memory cell transistors of said first and second non-volatile memory array sections having a common structure in source, drain, control gate and floating gate.

2. A non-volatile semiconductor memory device as defined in claim 1, wherein said group-by-group mode is bite-by-bite mode.

3. A non-volatile semiconductor memory device comprising a semiconductor substrate, a first non-volatile memory array section formed on said semiconductor substrate and having a plurality of memory cell transistors, a second non-volatile memory array section formed on said semiconductor substrate and having a plurality of memory cell transistors, a first erasing section for erasing said memory cell transistors of said first non-volatile memory array section in a separate mode, a second erasing section for erasing said memory cell transistors of said second non-volatile memory array section in a batch mode, a memory cell transistor of said first non-volatile memory array section including a floating gate having an area which is larger than an area of a floating gate of a memory cell transistor of said second non-volatile memory array section.

4. A non-volatile semiconductor memory device as defined in claim 3, wherein said memory cell transistor of said first non-volatile memory array section has a control gate having an area which is larger than an area of a control gate of said memory cell transistor of said second non-volatile memory array section.

5. A non-volatile semiconductor memory device as defined in claim 3, wherein said separate mode is bit-by-bit mode or bite-by-bite mode.

* * * * *